United States Patent [19]

Inoue et al.

[11] Patent Number: 5,468,344
[45] Date of Patent: Nov. 21, 1995

[54] METHOD FOR MANUFACTURING SEMICONDUCTOR DEVICES

[75] Inventors: Shunsuke Inoue, Yokohama; Junichi Hoshi, Hadano; Takanori Watanabe, Atsugi, all of Japan

[73] Assignee: Canon Kabushiki Kaisha, Tokyo, Japan

[21] Appl. No.: 186,541

[22] Filed: Jan. 26, 1994

[30] Foreign Application Priority Data

Jan. 29, 1993 [JP] Japan ................................. 5-032442

[51] Int. Cl.⁶ .......................... H01L 21/306; B44C 1/22; C03C 15/00
[52] U.S. Cl. ................................................ 156/657.1
[58] Field of Search .................................. 156/640, 646, 156/657, 662, 345

[56] References Cited

U.S. PATENT DOCUMENTS

| | | | |
|---|---|---|---|
| 4,473,455 | 9/1984 | Dean et al. | 156/345 X |
| 4,557,785 | 12/1985 | Ohkuma | 156/640 X |
| 4,759,817 | 7/1988 | Aigo | 156/345 |
| 4,903,717 | 2/1990 | Sumnitsch | 134/99 |
| 5,105,556 | 4/1992 | Kurokawa et al. | 34/12 |

FOREIGN PATENT DOCUMENTS

| | | | |
|---|---|---|---|
| 0434434A1 | 6/1991 | European Pat. Off. | H01L 21/306 |
| 0444714A1 | 9/1991 | European Pat. Off. | H01L 21/00 |
| 1227730 | 9/1986 | U.S.S.R. | |

*Primary Examiner*—William Powell
*Attorney, Agent, or Firm*—Fitzpatrick, Cella, Harper & Scinto

[57] ABSTRACT

The present invention is directed to a method for manufacturing semiconductor devices including a process of etching a member for use in making a semiconductor device. An improvement resides in a process for holding the member, using holding means which is placed into contact with the peripheries of the member, as well as forming a space including one face of the member, and a process for introducing a gas into the space, and blasting the gas from a clearance between the member and the holding means, as well as injecting an etching agent to the member from the opposite face side of the member to etch the other face of the member.

8 Claims, 3 Drawing Sheets

METHOD FOR MANUFACTURING SEMICONDUCTOR DEVICES

BACKGROUND OF THE INVENTION

1. Field of the Invention

The present invention relates to a method for manufacturing semiconductor devices having an etching process.

2. Related Background Art

Various forms of etching have been adopted for the manufacturing of semiconductor devices.

For example, when a pressure sensor or cantilever is fabricated on a silicon substrate by micromachining, a jig is used as shown in FIG. 4 to etch by immersion in an alkaline etching solution such as an anisotropic aqueous KOH solution.

In FIG. 4, 451 is an Si substrate to be etched, 452 is an anti-etching mask, and 453 is a portion (pattern) for undergoing the etching. An etching sample 451 is laid on a sample carrier 460 of a jig lower lid 458.

Then, an O-ring seal 454 is placed on the upper face of sample 451, on which a jig upper lid 455 having a groove for the O-ring 454 formed is placed. The jig upper lid 455 has a window 456 through which the etching solution enters. The window has a dimension smaller than the O-ring 454, and slightly larger than the pattern 453. Also, the upper lid 455 and the lower lid 458 are sealed by another O-ring 457.

By using such a jig when immersed, the sample 451 has direct contact with the etching solution only in the area where etching is desired. Accordingly, even if there is any Al wiring immersed in the etching solution on the back face side (sample carrier side) of the sample 451, for example, it is never corroded by the etching solution.

However, in etching in the above manner, an excess portion of the sample 451 for disposing the O-ring 454 was required outside of the pattern 453 desired to be etched.

For example, when a Si chip mounted with a semiconductor integrated circuit is subjected to etching, the increased chip area reduces the number of chips to be obtained from a wafer, thus directly increasing the chip costs.

Further, additional time for incorporating a sample into the jig is necessary. The O-ring 454 and the sample 451 must be placed in correct alignment. When it was incorporated only manually without the use of any precision apparatus, the alignment was not very precise, so that a further excess portion for absorbing an alignment error was required.

SUMMARY OF THE INVENTION

An object of the present invention is to provide a method for manufacturing semiconductor devices without any excess chip area in the etching process.

It is another object of the present invention to provide a method for manufacturing semiconductor devices having a clean etching process without producing contamination, with higher operativity and productivity.

It is a further object of the present invention to provide a method for manufacturing semiconductor devices including a process of etching a member for use in making a semiconductor device, characterized by comprising a process for holding the member, using holding means which is placed into contact with the peripheries of the member, as well as forming a space including one face of said member, and a process for introducing a gas into the space, and blasting the gas from a clearance between said member and the holding means, as well as injecting an etching agent to the member from the opposite face side of the member to etch the other face of the member.

DETAILED DESCRIPTION OF THE PREFERRED EMBODIMENTS

A method for manufacturing semiconductor devices according to the present invention is configured as follows.

A method for manufacturing semiconductor devices including a process for etching a member for making a semiconductor device, is characterized by comprising a process for holding said member, using holding means which is placed into contact with the peripheries of said member, as well as forming a space including one face of said member, and a process for introducing a gas into said space, and blasting said gas from a clearance between said member and said holding means, as well as injecting an etching agent to said member from the opposite face side of said member to etch the other face of said member.

In the present invention, because the etching agent is injected onto the member while blasting the gas introduced into the space formed by using holding means from the clearance between said member and said holding means, no etching agent will reach one face of the member placed in the space formed using said holding means. Thus, one face is never etched. Therefore, according to the present invention, considering an instance where an integrated circuit is formed on one face of the member, clean etching can be performed without causing any contamination on the integrated circuit. In the present invention, the member for making semiconductor device may be a semiconductor single crystal substrate (e.g., a silicon wafer), a silicon chip, an SOI (Silicon on Insulator) substrate, an insulating substrate, or a substrate having semiconductor material deposited thereon by CVD or sputtering.

In the present invention, the injection of the etching agent involves supplying the etching solution in a stream, shower or spray manner.

In the present invention, a space member for making the space formed using holding means for the member and the holding means may be formed integrally or separately. In the present invention, the gas introduced into the space may be appropriately selected from inert gases such as air, clean air, nitrogen, as well as He, Ar, and Ne, for example.

According to the present invention, in the etching process for the member for making a semiconductor device such as a semiconductor chip, there is no need for excess member area as conventionally required, resulting in smaller member area. It is therefore possible to provide more members cheaply.

Also, because this etching method has an enhanced operativity and productivity in etching and can be cleanly effected without causing contamination, the reliability of chips can be enhanced.

Also, because this etching method has excellent controllability, it can be applied to the extensive etching process which was conventionally difficult to implement.

The method for manufacturing semiconductor devices according to the present invention will now be described with reference to the drawings.

[EXAMPLE 1]

Figure 1:
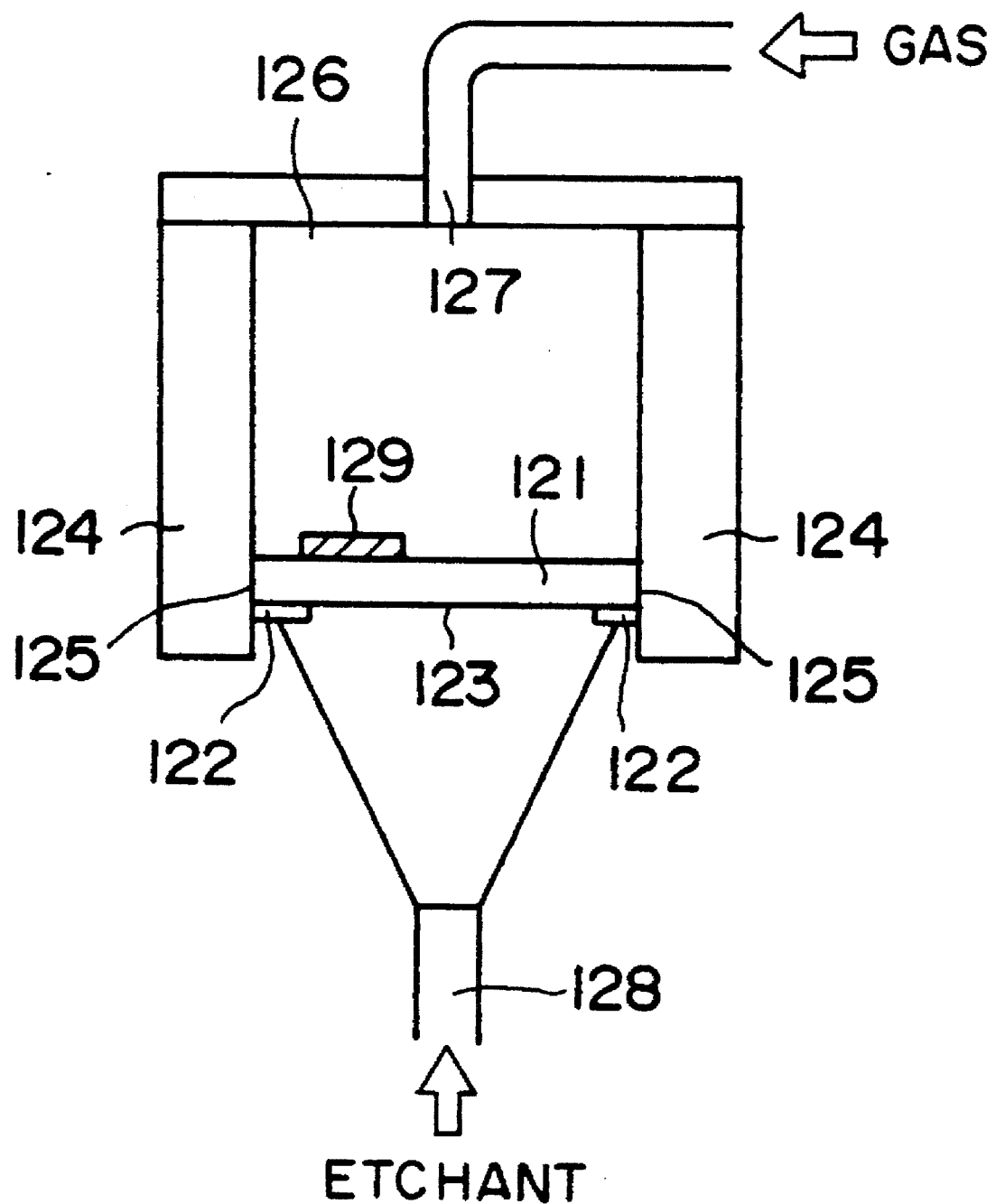
FIG. 1 is a typical view for explaining an etching process in the present invention.

Referring to FIG. 1, one example of the present invention will be described below.

In FIG. 1, 121 is a Si chip as the etched member having a thickness of 625 μm, and a size of about 15 mm×12 mm. 122 is an $SiO_2$ film which is an etching mask, having a thickness of approximately 1 μm. 123 is a portion to be etched, which is located approximately 1 mm apart from a chip edge 125 and has a size of 13 mm×10 mm. The chip edge 125 is clamped from four sides thereof by a clamp 124. The edge 125 is cut out substantially vertically from an Si wafer, normally with a precision of approximately ±10 μm, and thus has a very excellent shape. Hence, the clearance between the edge 125 and clamp 124 is very small except for the corner portion of chip.

Then, an inert gas such as air or nitrogen is introduced through a nozzle 127 into a substantially sealed space 126 formed by the clamp 124 at a pressure slightly higher than the external pressure (atmospheric pressure). The pressure must not be so high as to destroy the clamping of the chip, as described above. Introduced gas is blasted through the clearance between the edge 125 and the clamp 124.

Then, a KOH aqueous etchant solution is injected downward through a nozzle 128. The solution impinges on the lower surface of the member 121 in a stream, shower or spray, but no solution arrives at the upper face of the member and the edge 125 due to the gas being blasted. Therefore, an integrated circuit 129 which is formed on the upper face of the sample 121 is not immersed with the solution. This example is an open system in which the sample is clamped by the clamp, easily allowing for automation. The sample is easily clamped and removed without requiring any excess time. Also, there is no extra expense of the O-ring up to 4 mm, as was seen with a jig of the conventional example, the distance between the etching pattern 123 and the edge being only 1 mm or less.

Also, since the etching is performed in an inert atmosphere, corrosive mist and gas are prevented from arising from the etchant.

Also, the etching method can be easily changed to another method suitable for the member such as stream, shower or spray by changing the injection nozzle 128.

Also, rinsing or drying can be readily performed by blowing off the pure water or gas out of the nozzle, respectively.

Unlike the conventional jig, both principal planes critical for the chip are not touched in any case, so that no contamination is produced. Also, since the etchant is blown off from downwards any excess etchant will rapidly fall off the member and the clamp, so that the etchant does not contact the member unnecessarily.

Also, by blowing off the etchant from the nozzle at an arbitrary angle, the etching can progress in any direction.

By stopping the blowing off of the etching solution and immediately applying the rinsing solution, accurate etching termination can be attained.

In another example of the present invention, in addition to a KOH aqueous solution for the etchant, alkaline etchants presenting etching anisotropy can be employed, including, for example, ethylene diamine, pyrocatechol, their mixture, solutions with water, or TMAH (tetramethyl ammonium hydroxide) aqueous solution.

[EXAMPLE 2]

Figure 2:
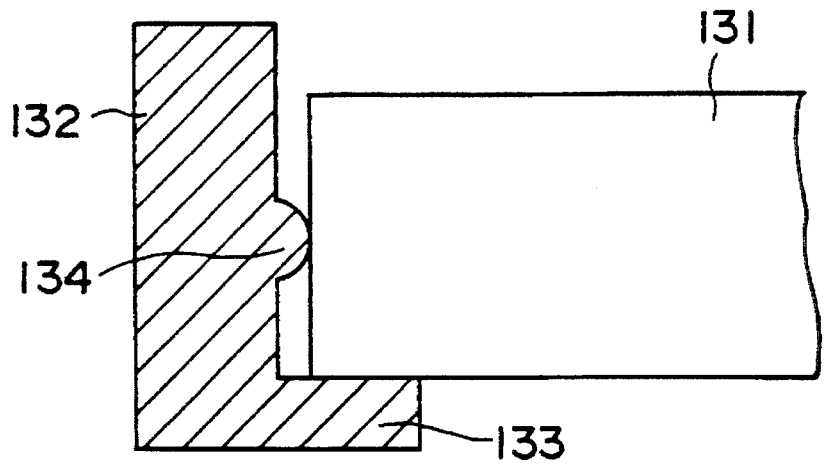
FIG. 2 is a typical view for explaining a clamp state in holding means of the present invention.

To improve the holding state, a claw 133 or a projection 134 may be provided to hold a sample 131 in a clamp 132 for supporting, as shown in FIG. 2.

[EXAMPLE 3]

Figure 3:
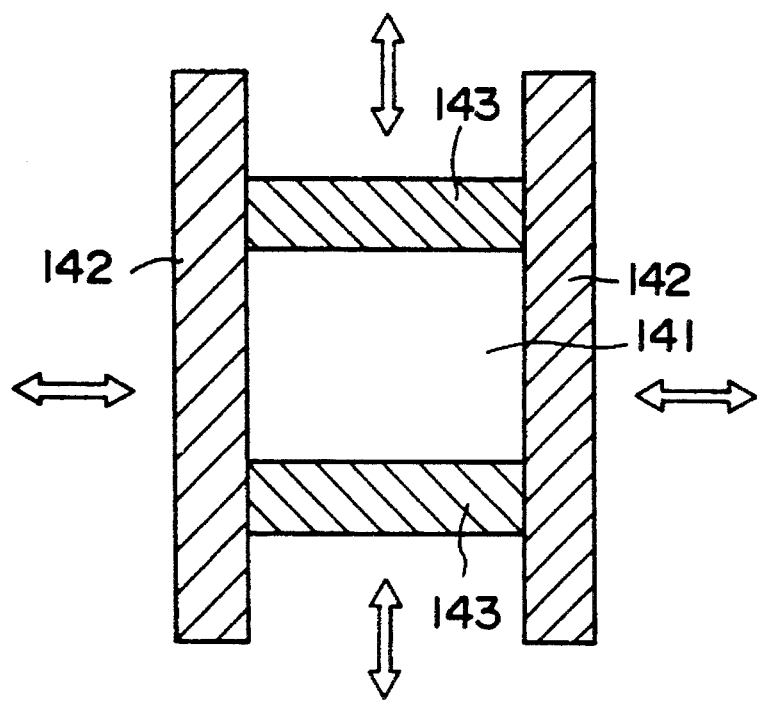
FIG. 3 is a typical view for explaining a clamp state in, holding means of the present invention.
Figure 4:
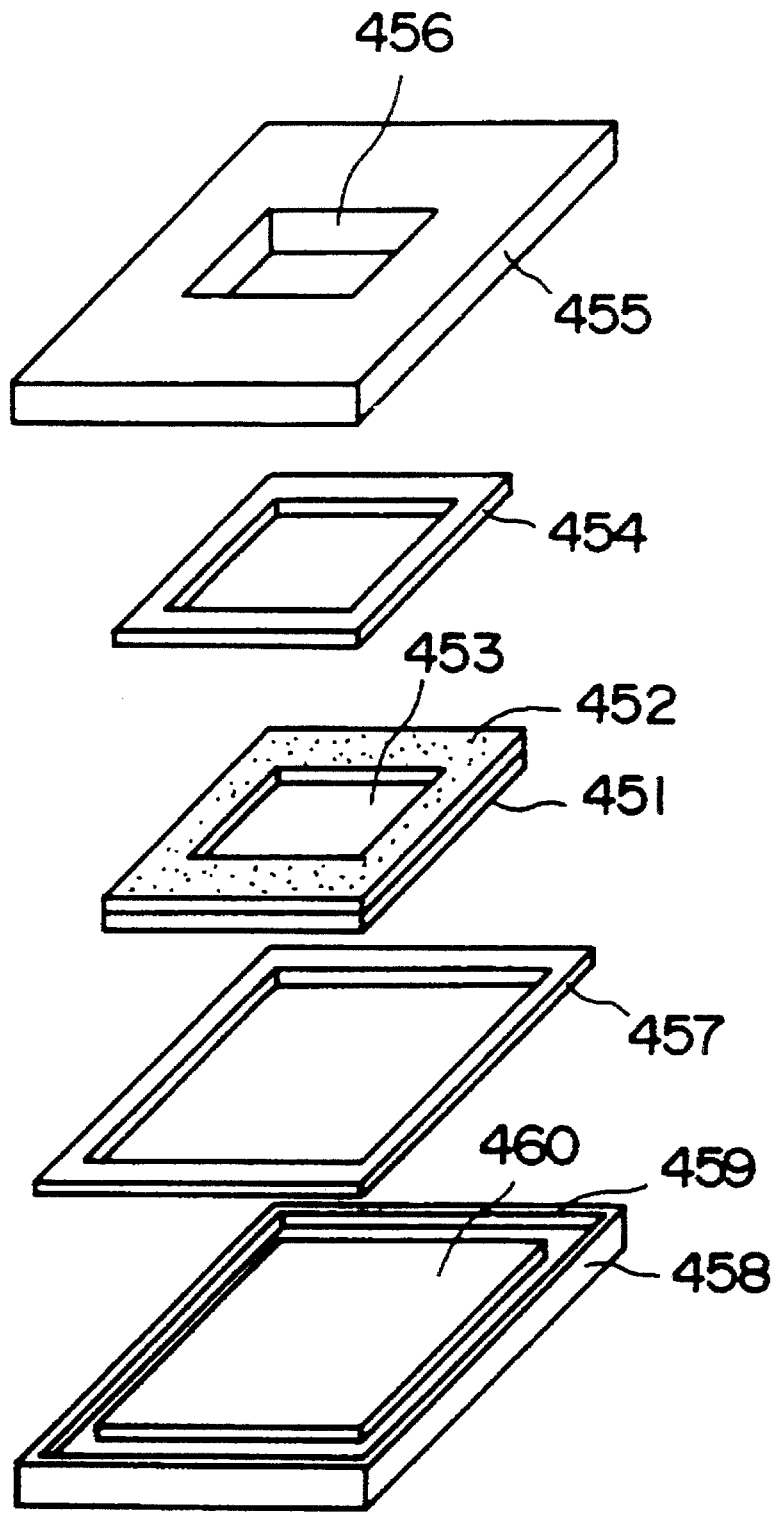
FIG. 4 is a typical view for explaining a conventional etching process.

To be able to clamp a member of variable size, clamps 142, 143 constituted as shown in FIG. 3 can be adopted. FIG. 3 is an upper face view showing a state where four side walls of a member to be etched (semiconductor chip) 141 are carried by two pairs of clamps 142, 143. As shown in the figure, an inner clamp 143 is movable inside an outer clamp 142, thereby dealing with the variable size of the sample 141.

[EXAMPLE 4]

Not only by pressurizing the gas to be introduced but also by reducing the pressure of the atmosphere, can the equivalent difference in pressure can be attained.

With such a constitution, the mist and gas arising from the area in direct contact with the etching solution residing downward can be safely exhausted.

What is claimed is:

1. A process for etching a member for use in a semiconductor device comprising:

placing the member to be etched in a holding means placed in contact with the peripheries of said member, so that a small clearance between the member and the holding means is created; said holding means and member together with a sealing member facing said member defining a substantially sealed space; providing a gas into said sealed spaces at a pressure sufficient to force gas through the clearance between the member and the holding means; and injecting an etching agent against the opposite side face of the member which is not blasted with said gas to etch the member.

2. A method according to claim 1, wherein the injection of said etching agent is performed by supplying an etching solution in a stream, shower or spray.

3. A method according to claim 1, wherein said member is constituted of a silicon chip.

4. A method according to claim 1, wherein the pressure of said space into which said gas is introduced is higher than the atmospheric pressure.

5. A method for manufacturing semiconductor devices according to claim 1, characterized in that said holding means is provided with a projection for holding said member.

6. A method for manufacturing semiconductor devices according to claim 1, characterized in that said holding means is provided with a claw for holding said member.

7. A method for manufacturing semiconductor devices according to claim 1, characterized in that said gas is air or clean air.

8. A method for manufacturing semiconductor devices according to claim 1, characterized in that said etching agent is injected from an injection orifice of nozzle shape, said injection orifice also serving as the injection orifice for the rinsing solution or drying gas.

* * * * *

UNITED STATES PATENT AND TRADEMARK OFFICE
CERTIFICATE OF CORRECTION

PATENT NO. : 5,468,344

DATED : November 21, 1995

INVENTOR(S) : SHUNSUKE INOUE ET AL.

Page 1 of 2

It is certified that error appears in the above-identified patent and that said Letters Patent is hereby corrected as shown below:

On the title page: Item
[56] REFERENCES CITED

Foreign Patent Documents,
    "1227730" should read --1257730--.

COLUMN 2

Line 13, "inholding"     should read --in holding--.
    Line 51, "spray manner." should read --spray.--.

COLUMN 3

Line 19, "an" should read --a--.
    Line 56, "downwards" should read --downward,--.

UNITED STATES PATENT AND TRADEMARK OFFICE
CERTIFICATE OF CORRECTION

PATENT NO. : 5,468,344

DATED : November 21, 1995

INVENTOR(S): SHUNSUKE INOUE ET AL.

It is certified that error appears in the above-identified patent and that said Letters Patent is hereby corrected as shown below:

<u>COLUMN 4</u>

```
Line 24, "can" should be deleted.
Line 43, "method" should read --process--.
Line 45, "method" should read --process--.
Line 47, "method" should read --process--.
Line 50, "method" should read --process--.
Line 54, "method" should read --process--.
Line 57, "method" should read --process--.
Line 60, "method" should read --process--.
```

Signed and Sealed this

Thirtieth Day of April, 1996

Attest:

BRUCE LEHMAN

*Attesting Officer*    *Commissioner of Patents and Trademarks*